United States Patent
Dahan

(10) Patent No.: US 7,991,104 B1
(45) Date of Patent: Aug. 2, 2011

(54) MODULAR LOW POWER GRAY CODE COUNTER

(75) Inventor: Nir Dahan, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 12/800,038

(22) Filed: May 6, 2010

(30) Foreign Application Priority Data

Apr. 29, 2010 (EP) .................................... 10368023

(51) Int. Cl.
H03K 21/00 (2006.01)

(52) U.S. Cl. ......................................... 377/34

(58) Field of Classification Search .................. None
See application file for complete search history.

(56) References Cited

U.S. PATENT DOCUMENTS

| | | | | |
|---|---|---|---|---|
| 5,045,854 A | * | 9/1991 | Windmiller | 341/97 |
| 5,097,491 A | * | 3/1992 | Hall | 377/34 |
| 5,164,968 A | * | 11/1992 | Otto | 377/34 |
| 6,269,138 B1 | | 7/2001 | Hansson | |
| 6,836,525 B1 | | 12/2004 | Weng | |
| 7,194,500 B2 | | 3/2007 | Clift | |

OTHER PUBLICATIONS

"Clock-Gating and Its Application to Low Power Design of Sequential Circuits," by Qing Wu et al., IEEE Transactions on Circuits and Systems-1: Fundamental Theory and Applications, vol. 47, No. 103, Mar. 2000, pp. 415-420.

"Gray counters implementation for direct increment/decrement," by Siemens AG et al., IP.com, PriorArt Database, Technical Disclosure, Published Sep. 10, 2006, Copyright Infineon Technologies 2006, pp. 1-6.

"Gray counter in VHDL," ING. IVO VISCOR, Proceedings of the Student FEI 2000, Bmo 2000, pp. 399-401.

* cited by examiner

Primary Examiner — Tuan Lam
(74) Attorney, Agent, or Firm — Saile Ackerman LLC; Stephen B. Ackerman

(57) ABSTRACT

A modular Gray code counter of arbitrary bit length having identical Gray code counter cells in every bit position. Each cell comprises a Toggle Flop and logic which triggers the Toggle Flop and sets the state of the Gray code counter cell. The two outputs of a cell feed two inputs of the next more significant cell. A parity flip-flop provides odd parity, and as a third input to the cell together with the other two inputs determines the state of the cell.

20 Claims, 6 Drawing Sheets

MODULAR LOW POWER GRAY CODE COUNTER

BACKGROUND OF THE INVENTION

1. Field of the Invention

The invention relates to the design of a Gray code counter and more particularly to a Gray code counter using a series of identical Gray code cells.

2. Description of the Related Art

Gray code counters counting up or down are know to be difficult to design. This is particularly true of Gray code counters with many stages (bits). One way to get around this problem is to convert a Gray code counter to a binary counter, do the incrementing or decrementing in binary and reconvert to a Gray code counter. This method is very inefficient, taking a lot of extra logic and thus chip area and power. A related art paper, Reference 1, is "Clock-Gating and Its Application to Low Power Design of Sequential Circuits" by Qing W U, Massoud PEDRAM, and Xunwei W U, Proc. of the IEEE Custom Integrated Circuits Conference, 2000.

A previous paper by the inventor of the present invention, Reference 2, "Gray counters implementation for direct increment/decrement", Nir Dahan, Sep. 10, 2006, prior art database reference IPCOM 000138896D.

However, there is a great pressure to further reduce the chip area and power consumption and to provide an efficient way for clock division which calls for new approaches not found in the related art and which the present invention addresses. Using a Gray structure/counter for clock division has the benefit that each of the different divisions (with the exception of the division by 2 stage) is changing on a different clock edge. This in turn helps tackle issues in complex chips such as IR drop by avoiding that a lot of current is pulled from the supply at once.

U.S. Patents and papers that relate to the present invention are:

U.S. Pat. No. 7,194,500 (Clift) describes a modular Gray code counter where each module comprises a flip-flop and a number of logic blocks. The first and last stage are given special consideration. Each module has five inputs and a clock input and two outputs the latter generally feeding the next stage.

U.S. Pat. No. 6,636,525 (Weng) discloses a modular Gray code counter capable of counting any number of elements. Each module, comprising a flip-flop and two or three logic blocks, has two inputs in addition to a clock and reset and two outputs. The two inputs of the flip-flop are fed by the outputs of the previous flip-flop.

U.S. Pat. No. 6,269,138 (Hansson) shows a low power Gray code counter which compares favourably to a low power binary counter. The counters consume a minimum of power when they are disabled and activated only when the data output has to be changed. Gray code stages comprise two flip-flops and typically three logic blocks.

"Gray counters in VHDL", by Ing. Ivo Viscor, In "Proceedings of the Student FEI 2000, Brno 2000, pp. 399-401, discusses the use of Very High Speed Integrated Circuit (VHSIC) Hardware Description Language (VHDL) for designing a Gray code counter. Requirements were code simplicity and adjustable width of the counter, auxiliary bit generation, a series of one-bit blocks and glue logic for MSB generation.

It should be noted that none of the above-cited examples of the related art provide the advantages of the below-described invention.

SUMMARY OF THE INVENTION

It is an object of at least one embodiment of the present invention to provide a modular Gray code counter circuit and a method comprising identical Gray code cells, coupled serially to each other from a least significant bit to a most significant bit.

It is another object of the present invention to provide a modular Gray code counter circuit of arbitrary size.

It is yet another object of the present invention to provide a low power modular Gray code counter circuit.

It is still another object of the present invention to provide a modular Gray code counter circuit with efficient synchronous clock division.

It is a further object of the present invention is to replace toggle flip-flops with Toggle Flops.

It is yet a further object of the present invention is to provide a Gray code counter which is more area efficient.

These and many other objects have been achieved by creating a Gray code counter of n bits by serially coupling n number of identical Gray code cells from a least significant bit to a most significant bit thus creating a Gray code counter of arbitrary size. How many bits the Gray code counter has is not critical as far as clocking is concerned because a locally clock gated Toggle Flop is used, that is gating of the clock of each cell is determined solely by the Gray code counter cell clock. Individual delays caused by the layout of the Gray code counter on a chip plus loading of clock lines or any other delays, do therefore not affect the timing of the Toggle Flop clocking. The use of Toggle Flops instead of toggle flip-flops and minimized logic of the Gray code cell, the latter only requiring three logic gates, lower the power consumption and a more reduce the required chip area over the related art. Efficient synchronous clock division significantly by reduces the IR drop to the circuits on the chip and thus avoids pulling a lot of current from the power supply at the same time. The Gray counter of the present invention also outperforms the related art as counter bit width grows.

Referring now to FIG. 5a and FIG. 5b, we show a comparison between a binary clock division and a Gray clock division, respectively. In the binary clock division scheme more than one of the divided clocks changes in the same point in time, while in the Gray clock division scheme all clock divisions (with the exception of the divide by 2 stage—the parity bit) each change at a different point in time. FIG. 5a depicts the following wave trains from top to bottom:
Source clock,
Binary bit 0—divide by 2,
Binary bit 1—divide by 4,
Binary bit 2—divide by 8,
Binary bit 3—divide by 16;
where the division factors relate to the Source clock.
FIG. 5b depicts the following wave trains from top to bottom:
Source clock,
Parity—divide by 2,
Gray bit 0—divide by 4,
Gray bit 1—divide by 8,
Gray bit 2—divide by 16,
Gray bit 3—divide by 16;
where the division factors relate to the Source clock.

We next refer to FIG. 6. The graph of FIG. 6 is the result of a power analysis comparing a normal binary counter (Curve 1), a modular clock gated binary counter of the style published by Massoud et al., Reference 1 (Curve 2), and the modular clock gated Gray counter of the present invention (Curve 3).

The y-axis represents the relative dissipated power—units are not applicable. The x-axis represents the counter width in bits.

One can observe that the relative power savings of Curve 3 compared to a normal binary counter, Curve 1, is on the order of 3. While the relative power savings of Curve 3 compared to Curve 2, the proposed binary counter given in Reference 1, is approximately a factor of 1.75. The proposed Gray counter also outperforms the related art as counter bit width grows.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

Use of the same reference number in different figures indicates similar or like elements.

DESCRIPTION OF THE PREFERRED EMBODIMENT

Figure 1:
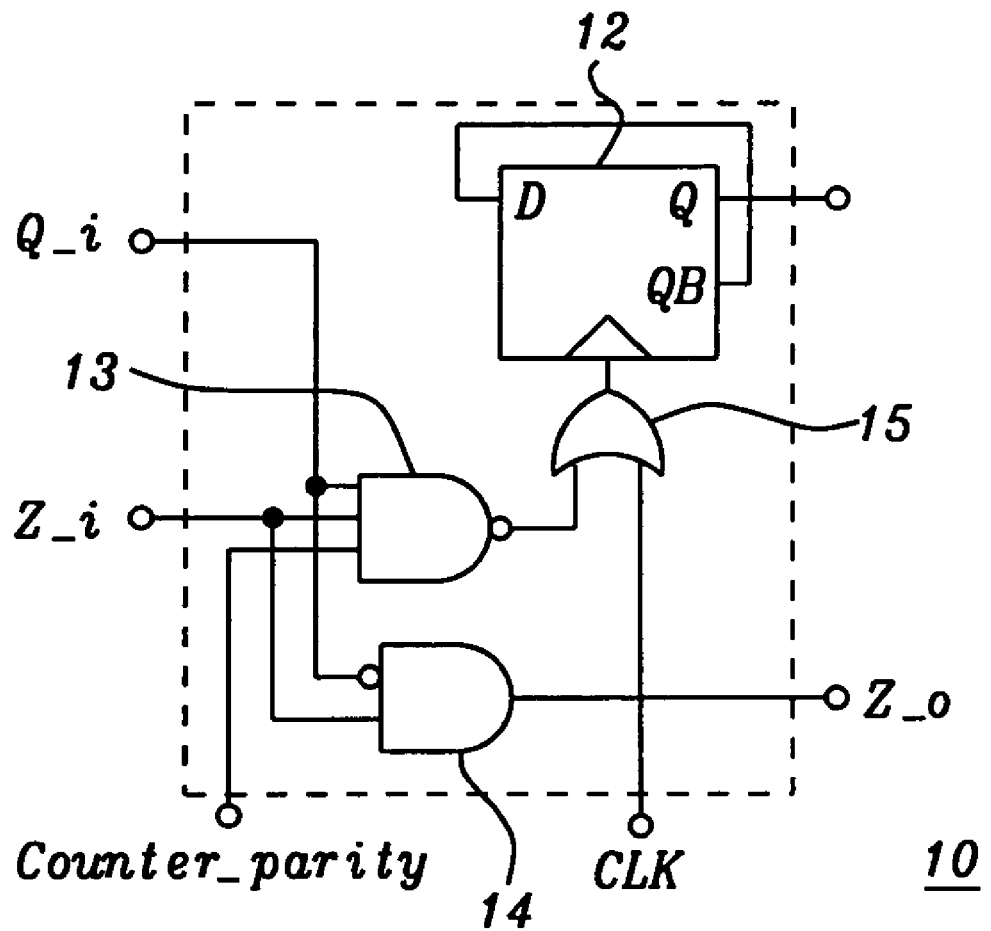
FIG. 1 is a diagram of a Gray code counter cell of the preferred embodiment of the present invention.

Referring now to FIG. 1, we describe in a preferred embodiment of the present invention a "Gray code counter cell" which is locally clock gated and comprises a Toggle Flop. The term "Toggle Flop" describes a flip-flop where the only inputs to the flip-flop are its own output aside from a clock. The Gray code counter cell has, apart from the normal clock input (and possible asynchronous reset input, which is not depicted), three other inputs. They are:

Q_i—the Gray code value of the previous less significant stage,

Z_i—an indication whether all stages prior to the previous less significant stage are logical zero (shall be referred to from now on as the "Z-function"), Counter_parity—a parity signal indicating whether the counter has odd or even parity. For Gray coded counters the parity changes with each cycle. In the present invention the parity is "odd", that is there are an odd number of "ones" in the Gray code including the Counter parity bit.

The outputs of each Gray code counter cell are:

Q_o—the Gray code value of the current stage,

Z_o—the "Z-function" value for the next stages.

We now describe in detail a preferred embodiment of FIG. 1. Gray code counter cell 10 comprises a Toggle Flop 12, a 3-way logic NAND gate 13, a 2-way logic AND gate 14 and a 2-way logic OR gate 15. Cell 10 has inputs Q_i, Z_i, Counter_parity and Clock signal CLK. Outputs of Cell 10 are Q_o and Z_o. Gate 13 receives inputs from Q_i, Z_i, and Counter_parity. Gate 14 receives Q_i at an inverted input and Z_i. The output of 14 drives Z_o. Gate 15 receives inputs from the output of 13 and input Clock signal CLK. The output of 15 feeds the clock input of 12. The output Q of 12 is coupled to output Q_o. The inverted output of Q is QB which couples back to input D of 12.

Figure 2:
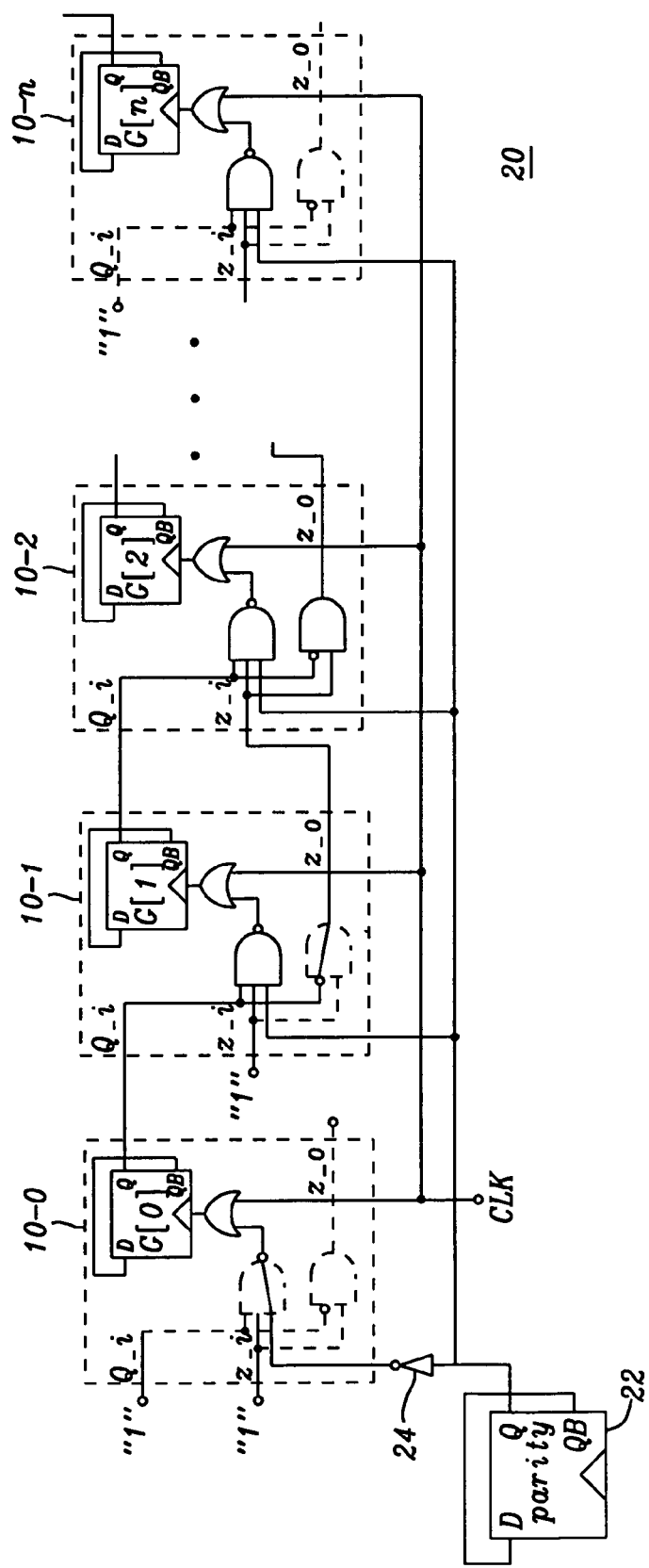
FIG. 2 is a diagram of an arbitrary length n Gray code counter of the preferred embodiment of the present invention.

In order to generate a full blown Gray counter, the cells have to be connected together with some minor exceptions. FIG. 2 depicts a general arbitrary length Gray code counter of n+1 bits. All dashed lines in FIG. 2 are unused. Therefore we obtain the following connectivity rules:

For a general Gray code counter stage which is neither Stage 0 (LSB), nor Stage 1 (LSB+1), nor Stage n (MSB): connect outputs Q_o and Z_o of the previous stage to the Q_i and Z_i inputs, respectively, of the current stage. Connect the parity bit and the clock to their respective inputs of the cell.

For Stage 0 (LSB): connect Z_i and Q_i to logic "1" and invert the parity bit input. The clock is connected normally.

For Stage 1 (LSB+1): connect Z_i to logic "1", Q_i to the previous stage's Q_o output, the parity and clock pins are connected normally.

For Stage n (MSB): connect Q_i to logic "1", Z_i is connected to the previous stage's Z_o, the parity and clock pins are connected normally.

The parity bit is generated by a normal flip-flop with inverse feedback that changes state with each clock edge.

Note that FIG. 2 contains solid lines within some logic gates. These connections, given the above connectivity rules, are "transformed" in essence into simple wires during the logic synthesis of the circuit. In effect, the special connectivity rules for some of the cells (e.g. driving an input with a logic "1") will eliminate the need of a logic gate. Not eliminated are the logic negation of an AND, i.e. the inverter at the output of the AND stays. This also applies to a negated input of a logic block.

We now describe in detail a preferred embodiment of FIG. 2 with reference to FIG. 1. The n+1 bits Gray code counter 20 comprises n+1 Gray code counter cells 10 of FIG. 1. They are labeled from bit 0, 1, 2 to bit n as 10-0 (G[0]), 10-1 (G[1]), 10-2 (G[2]) to 10-n (G[n]), respectively. Counter parity generator 22 comprises a normal flip-flop with input D and output Q and inverted output QB. Output Q feeds both Inverter 24 and input Counter_parity for stages 10-1 to 10-n. Inverter 24 feeds input Counter_parity of Gray code counter cell 10-0. Clock signal CLK feeds all n+1 Gray code counter cells 10-0 to 10-n. FIG. 2 illustrates the connections discussed previously above for Stages 0, Stage 1, and Stage n. Stage 2 to Stage n−1 are coupled to their respective next stages in the following manner:

Q_o feeds Q_i,

Z_o feeds Z_i.

Figure 3:
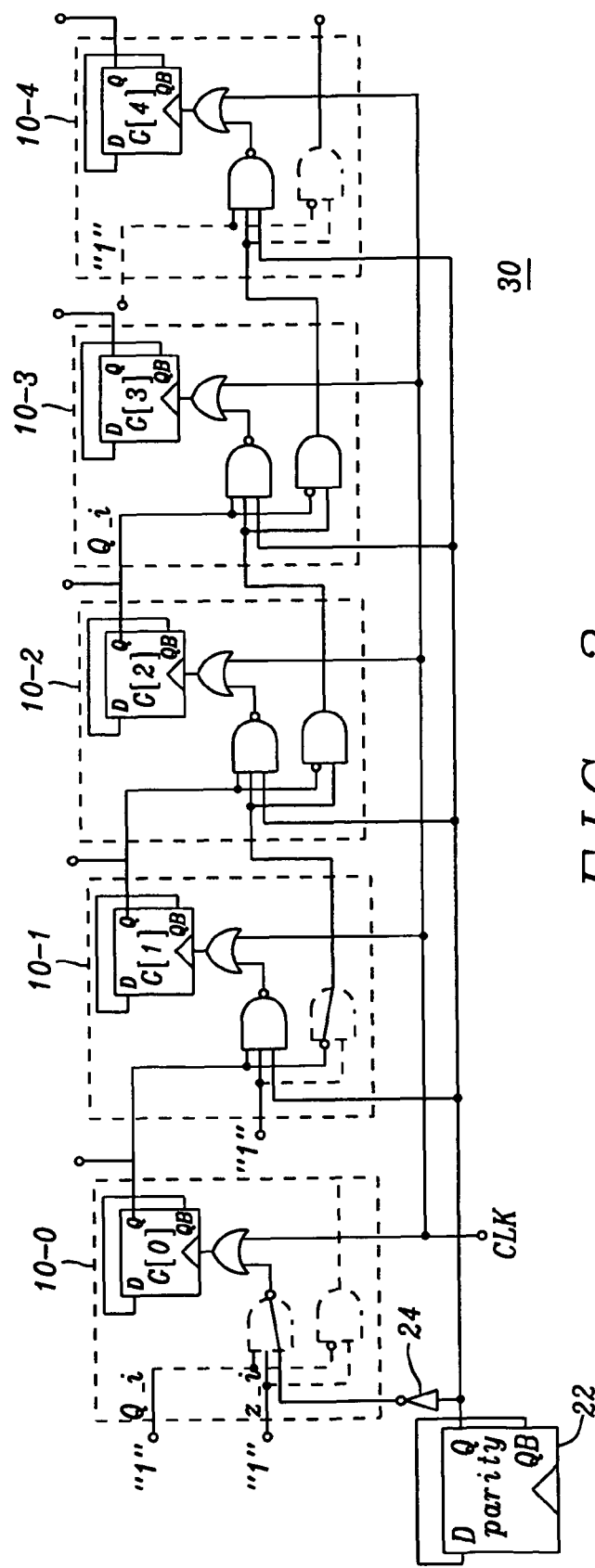
FIG. 3 is a full implementation of a 5 bit Gray code counter of the preferred embodiment of the present invention.

We now describe in detail a preferred embodiment of FIG. 3 with reference to FIGS. 1 and 2. FIG. 3 illustrates the full implementation of a 5 bit Gray code counter 30 comprising bits 0 to 4 with the corresponding connectivity. The 5 bit Gray code counter comprises 5 Gray code counter cells 10 of FIG. 1. Bits 0, 1, 2, 3, 4, and 5 are labeled 10-0 (G[0]), 10-1 (G[1]), 10-2 (G[2]), 10-3 (G[3]), and 10-4 (G[4]), respectively. Counter parity generator 22, Inverter 24, and Clock signal CKL are connected identical to FIG. 2. As in FIG. 2, all dashed lines are unused. Solid lines within gate 13 of 10-0 and gate 14 of 10-1 replace these gates. Not used are:

Q_i and Z_i of 10-0,

Z_i of 10-1, and

Q_i and Z_i of 10-5.

Q of 10-0, 10-1, 10-2, 10-3, and 10-4 are the outputs of the 5 bit Gray code counter 30.

In another description of the preferred embodiment of the present invention and referring to FIGS. 1, 2 and 3, the Gray code counter, comprises:

a plurality of Gray code cells 10 serially coupled from a least significant bit 10-0 to a most significant bit, together forming a Gray code, the Gray code cells 10 all identical, where each Gray code cell is a Gray code counter bit, each of the Gray code cells having a first input Q_i, a second input Z_i, a third input Counter_parity, a first output Q_o, and a second output Z_o, and where the second output of the Gray code cell is at a logical "1" when the Gray code cell and all previous Gray code cells in less significant positions are all "0", where each of the Gray code cells further comprises:

A Toggle Flop 12 having a data input D, an in-phase output Q, and out-of-phase output QB, the Toggle Flop changing state when a locally gated clock trigger is applied to the clock terminal of the Toggle Flop, where the out-of-phase output is coupled to the data input of the Toggle Flop and where the in-phase output of the Toggle Flop is coupled to the first output of the Gray code cell.

A control logic coupled to the first, second and third input of the Gray code cell, the control logic further generating the locally gated clock trigger to the clock terminal based on the state of the first, second, and third input of the Gray code cell, where an output of the control logic is coupled to the second output of the Gray code cell signaling, based on the first and second input of the Gray code cell, when to toggle a next more significant bit Gray code cell where the first and second input of the Gray code cell in the least significant bit position 10-0 are tied to a logical "1";

where the first input of the Gray code cell in the least significant bit position +1 (10-1) is coupled to the first output of the Gray code cell in the least significant bit position, and where the second input of the Gray code cell in the least significant bit position +1 is tied to a logical "1";

where the first and second input of the Gray code cells in a position between the least significant bit position +1 and the most significant bit position are coupled to the first output and the second output, respectively, of Gray code cells one bit position lower; where the first input of the Gray code cell in the most significant bit position is coupled to a logical "1" and where the second input of the Gray code cell in the most significant bit position is coupled to the second output of the Gray code cell in the most significant bit position −1.

A Counter parity toggle flip-flop 22 to provide counter parity for the Gray code counter, the Counter parity toggle flip-flop changing state with every clock cycle, the Counter parity toggle flip-flop providing an out-of-phase signal to the third input of the Gray code cell in the least significant bit position and an in-phase signal to the third input of the Gray code cells in higher positions than the least significant bit position.

A clock signal is coupled to a fourth input of the plurality of Gray code cells, the clock signal gating an output of a logic AND, inputs of the AND comprising the first, second, and third input of the Gray code cell, thereby applying the locally gated clock trigger to the clock terminal.

The control logic generates the trigger to the clock terminal when the first input of the Gray code cell is a logical "1" (that is a previous less significant Gray code cell is a "1") and when the second input of the Gray code cell is a logical "1" (that is when Gray code cells before the previous less significant Gray code cell are all "0's", i.e. when the Z function is a "1") and when the Counter parity toggle flip-flop is at a logical "1".

The control logic generates a logical "1" at the second output of the Gray code cell when the first input of the Gray code cell is a logical "0" (that is a previous less significant Gray code cell is a "0") and when the second input of the Gray code cell is a logical "1", that is when Gray code cells before the previous less significant Gray code cell are all "0's, i.e. when the Z function is a "1".

Figure 4:
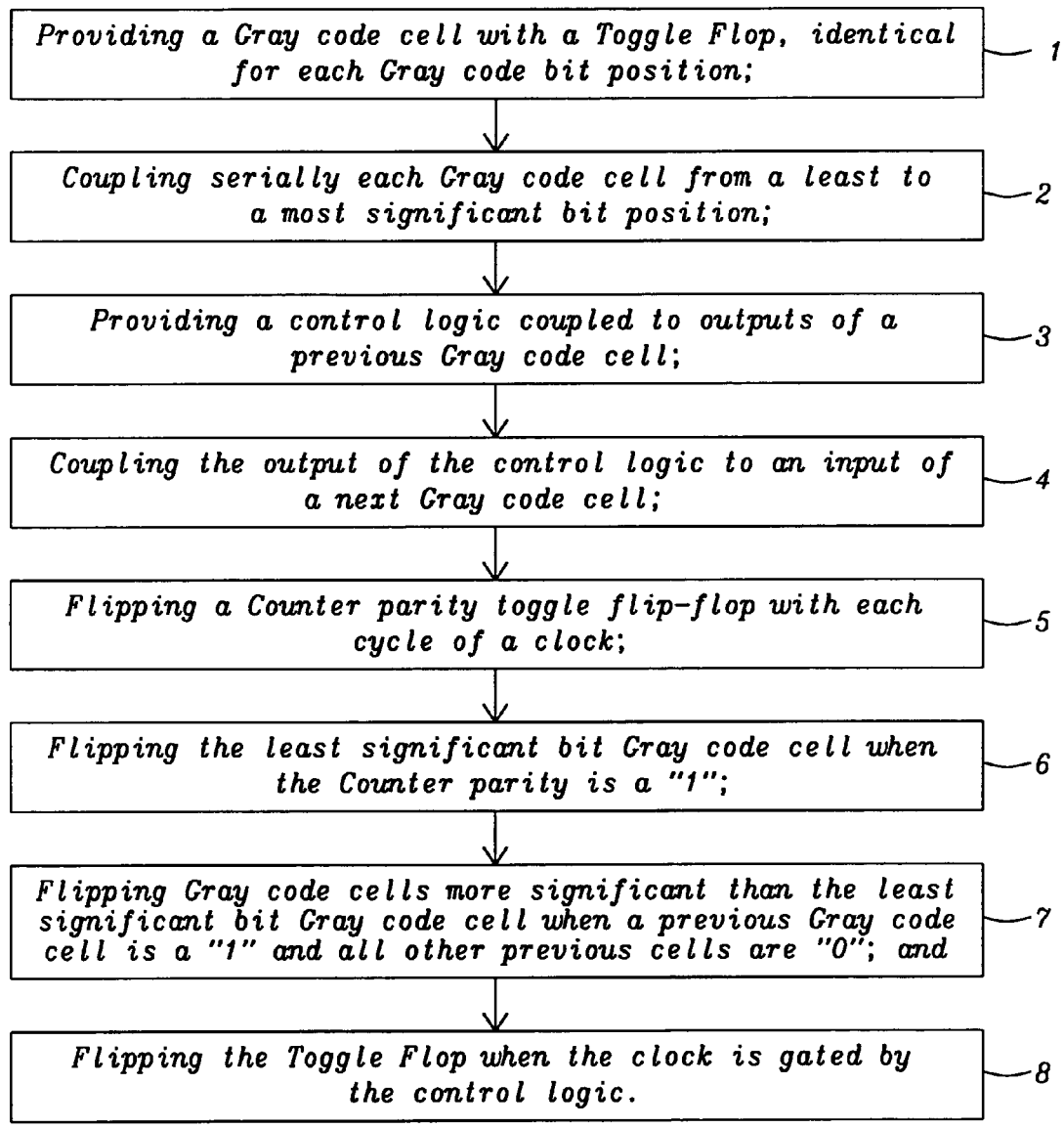
FIG. 4 is a block diagram of the method of the invention.
Figure 5A:
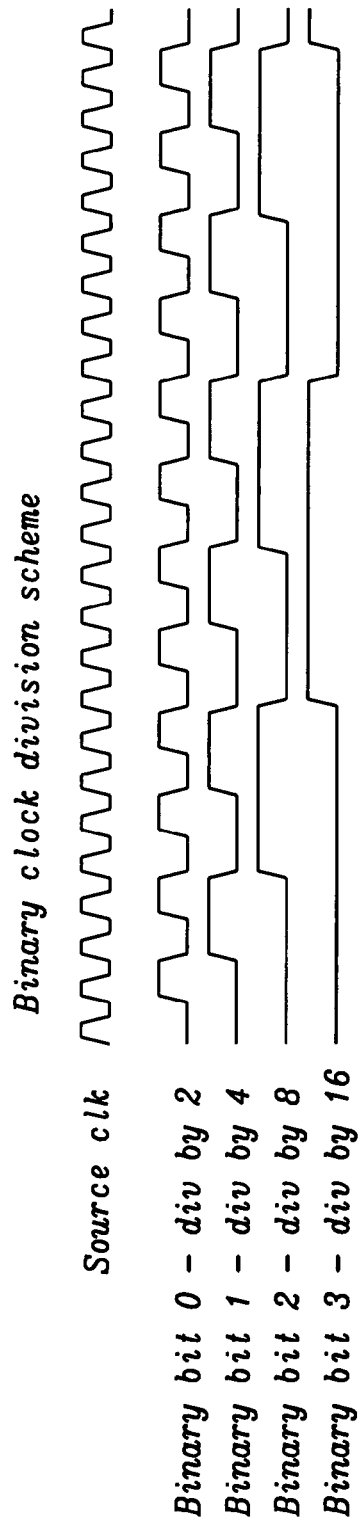
FIG. 5a is a wave-train diagram of a binary clock division scheme.
Figure 5B:
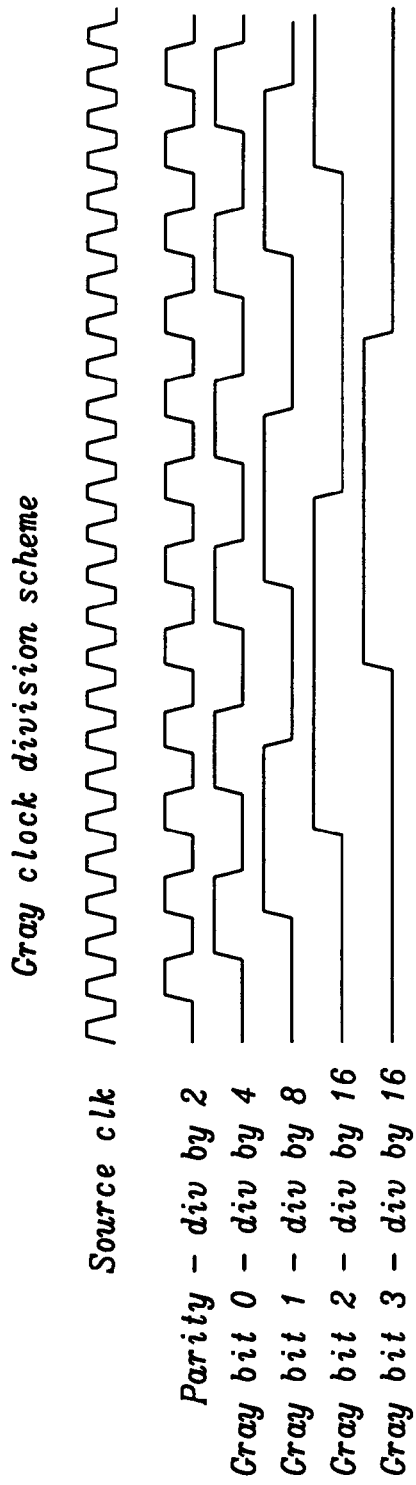
FIG. 5b is a wave-train diagram of the Gray clock division scheme of the present invention.
Figure 6:
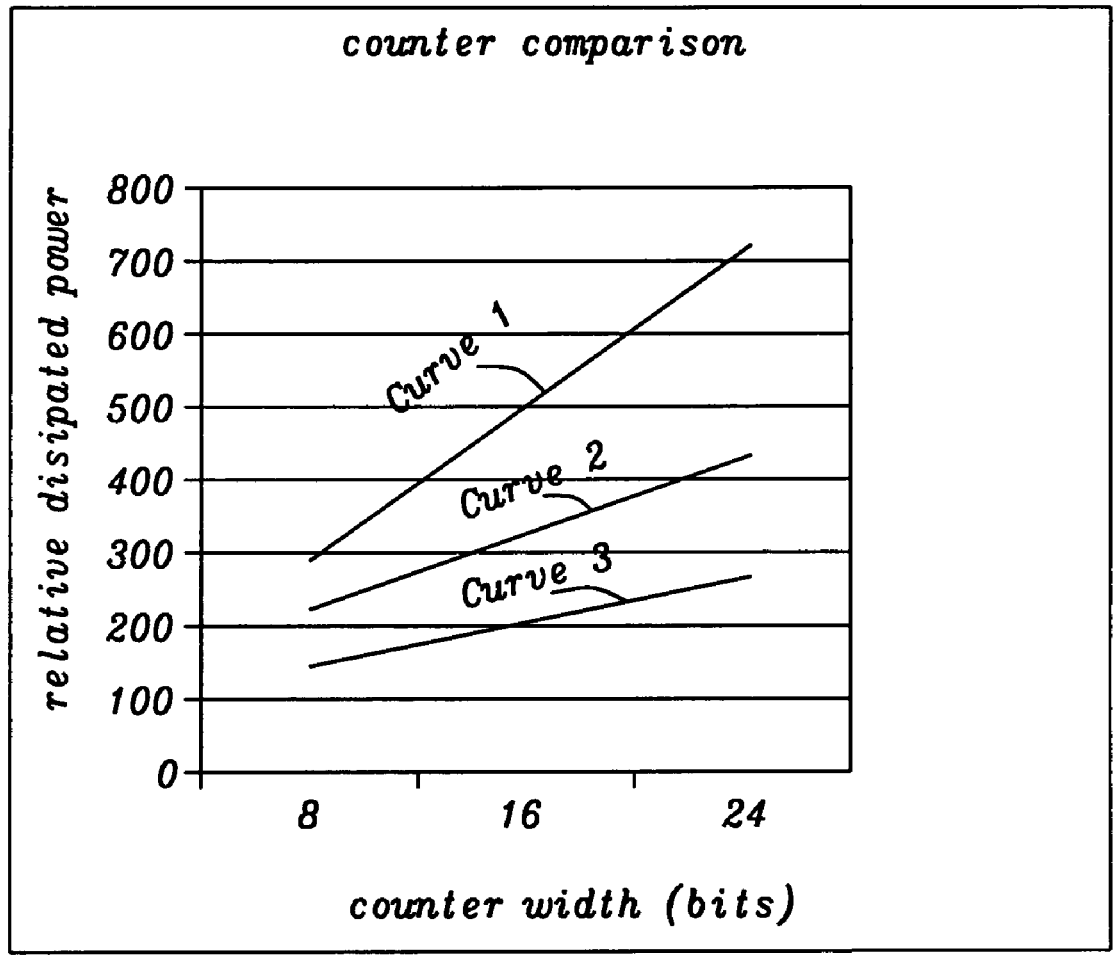
FIG. 6 is a graph comparing relative dissipated power of related art counters with that of the Gray code counter scheme of the present invention.

We now describe with reference to FIG. 4 a preferred method of creating a Gray code counter having identical Gray code cells:

Block 1 provides a Gray code cell with a Toggle Flop, identical for each Gray code bit position;

Block 2 couples serially each Gray code cell from a least to a most significant bit position;

Block 3 provides a control logic coupled to outputs of a previous Gray code cell;

Block 4 couples the output of the control logic to an input of a next Gray code cell;

Block 5 flips a Counter parity toggle flip-flop with each cycle of a clock;

Block 6 flips the least significant bit Gray code cell when the Counter parity is a "1";

Block 7 flips Gray code cells more significant than the least significant bit Gray code cell when a previous Gray code cell is a "1" and all other previous Gray code cells are "0", and Block 8 flips the Toggle Flop when the clock is gated by the control logic.

While the invention has been particularly shown and described with reference to the preferred embodiments thereof, it will be understood by those skilled in the art that various changes in form and details may be made without departing from the spirit and scope of the invention.

What is claimed is:

1. A Gray code counter, comprising:

a plurality of Gray code cells serially coupled from a least significant bit to a most significant bit, together forming a Gray code, said Gray code cells all identical, where each said Gray code cells is a Gray code counter bit, each said Gray code cells having a first input, a second input, a first output, and a second output, and where said second output of said Gray code cell is at a logical "1" when said Gray code cell and all previous Gray code cells in less significant positions are all "0", each of said Gray code cells further comprising:

a Toggle Flop having a data input and outputs, said Toggle Flop changing state when a locally gated clock trigger is applied to a clock terminal of said Toggle Flop, where a first output of said Toggle Flop is said first output of said Gray code cell;

a control logic receiving its inputs from said first input and said second input of said Gray code cell, said control logic generating said locally gated clock trigger to said clock terminal, said control logic further signaling at said second output of said Gray code cell when to toggle a next more significant bit Gray code cell; and a Counter parity toggle flip-flop to provide counter parity for said Gray code counter, said Counter parity toggle flip-flop changing state with every clock cycle, said Counter parity toggle flip-flop coupled to a third input of said plurality of Gray code cells.

2. The Gray code counter of claim 1, wherein a second output of said Toggle Flop is coupled to said data input, where said second output is of opposite phase to said first output of said Toggle Flop.

3. The Gray code counter of claim 1, wherein
said first input and said second input of said Gray code cell
in said least significant bit position are tied to logical
"1's".

4. The Gray code counter of claim 1, wherein
said first input of said Gray code cell in said least significant bit position +1 is coupled to said first output of said Gray code cell in said least significant bit position and where said second input of said Gray code cell in said least significant bit position +1 is tied to a logical "1".

5. The Gray code counter of claim 1, wherein
said first input and said second input of said Gray code cells in a position between said least significant bit position +1 and said most significant bit position are coupled to said first output and said second output, respectively, of said previous Gray code cells.

6. The Gray code counter of claim 1, wherein
said first input of said Gray code cell in said most significant bit position is coupled to a logical "1" and where said second input of said Gray code cell in said most significant bit position is coupled to said second output of said Gray code cell in said most significant bit position −1.

7. The Gray code counter of claim 1, wherein
said third input of said Gray code cell in said least significant bit position is coupled to an out-of-phase output of said Counter parity toggle flip-flop.

8. The Gray code counter of claim 1, wherein
said third input of said plurality of Gray code cells in said least significant bit position +1 and higher are coupled to an in-phase output of said Counter parity toggle flip-flop.

9. The Gray code counter of claim 1, wherein
a fourth input of said plurality of Gray code cells receives a clock signal gating an AND of signals from said first, said second and said third input, thereby applying said locally gated clock trigger to said clock terminal.

10. A Gray code counter, comprising:
a plurality of Gray code cells serially coupled from a least significant bit to a most significant bit, together forming a Gray code, said Gray code cells all identical, where each said Gray code cell is a Gray code counter bit, each of said Gray code cells having a first input, a second input, a third input, a first output, and a second output, and where said second output of said Gray code cell is at a logical "1" when said Gray code cell and all previous Gray code cells in less significant positions are all "0", each of said Gray code cells further comprising:
  a Toggle Flop having a data input, an in-phase output, and an out-of-phase output, said Toggle Flop changing state when a locally gated clock trigger is applied to a clock terminal of said Toggle Flop, where said out-of-phase output is coupled to said data input of said Toggle Flop and where said in-phase output of said Toggle Flop is coupled to said first output of said Gray code cell;
  a control logic coupled to said first input, said second input, and said third input of said Gray code cell, said control logic further generating said locally gated clock trigger to said clock terminal based on the state of said first input, said second input, and said third input of said Gray code cell, where an output of said control logic is coupled to said second output of said Gray code cell signaling, based on said first input and said second input of said Gray code cell, when to toggle a next more significant bit Gray code cell;
  where said first input and said second input of said Gray code cell in said least significant bit position are tied to a logical "1";
  where said first input of said Gray code cell in said least significant bit position +1 is coupled to said first output of said Gray code cell in said least significant bit position, and where said second input of said Gray code cell in said least significant bit position +1 is tied to a logical "1";
  where said first input and said second input of said Gray code cells in a position between said least significant bit position +1 and said most significant bit position are coupled to said first output and said second output, respectively, of Gray code cells one bit position lower;
  where said first input of said Gray code cell in said most significant bit position is coupled to a logical "1" and where said second input of said Gray code cell in said most significant bit position is coupled to said second output of said Gray code cell in said most significant bit position −1; and
a Counter parity toggle flip-flop to provide counter parity for said Gray code counter, said Counter parity toggle flip-flop changing state with every clock cycle, said Counter parity toggle flip-flop providing an out-of-phase signal to said third input of said Gray code cell in said least significant bit position and an in-phase signal to said third input of said Gray code cells in higher bit positions than said least significant bit position.

11. The Gray code counter of claim 10, wherein
a clock signal is coupled to a fourth input of said plurality of Gray code cells said clock signal gating an output of a logic AND, inputs of said AND comprising said first input, said second input, and said third input of said Gray code cell, thereby applying said locally gated clock trigger to said clock terminal.

12. The Gray code counter of claim 10, wherein said control logic
generates said trigger to said clock terminal when said first input of said Gray code cell is a logical "1", that is the previous less significant Gray code cell is a "1", and when said second input of said Gray code cell is a logical "1", that is when Gray code cells before said previous less significant Gray code cell are all "0's", and when said Counter parity toggle flip-flop is at a logical "1".

13. The Gray code counter of claim 10, wherein said control logic
generates a logical "1" at said second output of said Gray code cell when said first input of said Gray code cell is a logical "0", that is a previous less significant Gray code cell is a "0", and when said second input of said Gray code cell is a logical "1", that is when Gray code cells before said previous less significant Gray code cell are all "0's.

14. A method constructing a Gray code counter, comprising the steps of:
 a) providing a Gray code cell with a Toggle Flop, identical for each Gray code bit position;
 b) coupling serially each of said Gray code cells from a least to a most significant bit position;
 c) providing a control logic coupled to outputs of a previous Gray code cell;
 d) coupling an output of said control logic to an input of a next Gray code cell;
 e) flipping a Counter parity toggle flip-flop with each cycle of a clock;
 flipping said least significant bit Gray code cell when Counter parity is a "1";

g) flipping Gray code cells more significant than said least significant bit Gray code cell when a previous Gray code cell is a "1" and all other previous Gray code cells are "0"; and h) flipping said Toggle Flop when a clock input of said Gray code cell is gated by said control logic.

15. The method of claim 14, wherein said least significant bit Gray code cell has first and second inputs tied to a logical "1".

16. The method of claim 14, wherein said least significant bit +1 Gray code cell has a first input coupled to a first output of said least significant bit Gray code cell and a second input tied to a logical "1".

17. The method of claim 14, wherein Gray code cells between said least significant bit +1 Gray code cell and a most significant bit Gray code cell have a first output and a second output coupled to a first input and a second input of a next significant bit Gray code cell, respectively.

18. The method of claim 14, wherein said most significant bit Gray code cell has a first input tied to a logical "1" and a second input coupled to a second input of a previous Gray code cell.

19. The method of claim 14, wherein an output of said Counter parity toggle flip-flop is coupled to a third input said control logic.

20. The method of claim 14, wherein a locally gated clock trigger is applied to said Toggle Flop by gating a clock input of said control logic with a signal generated by said control logic.

\* \* \* \* \*